US009147923B2

(12) United States Patent
Han et al.

(10) Patent No.: US 9,147,923 B2
(45) Date of Patent: Sep. 29, 2015

(54) DIFFERENTIAL MODE AMPLIFIER DRIVING CIRCUIT

(75) Inventors: Myeong Woo Han, Gyunggi-do (KR); Jung Aun Lee, Gyunggi-do (KR); Kook Joo Lee, Seoul (KR); Moonil Kim, Gyunggi-do (KR)

(73) Assignees: Samsung Electro-Mechanics Co., Ltd., Suwon-si (KR); Korea University Research & Business Foundation, Seoul (KR)

( * ) Notice: Subject to any disclaimer, the term of this patent is extended or adjusted under 35 U.S.C. 154(b) by 768 days.

(21) Appl. No.: 13/420,267

(22) Filed: Mar. 14, 2012

(65) Prior Publication Data

US 2013/0169376 A1 Jul. 4, 2013

(30) Foreign Application Priority Data

Dec. 28, 2011 (KR) ........................ 10-2011-0145244

(51) Int. Cl.
*H03H 11/32* (2006.01)
*H01P 5/10* (2006.01)
*H03F 1/56* (2006.01)

(52) U.S. Cl.
CPC ........................................ *H01P 5/10* (2013.01)

(58) Field of Classification Search
CPC ............... H01P 5/10; H03H 7/42; H03F 3/04; H03F 3/45
USPC ............... 333/25, 26; 330/188, 195, 252, 301
See application file for complete search history.

(56) References Cited

U.S. PATENT DOCUMENTS 6,998,930 B2 * 2/2006 Tabatchnick et al. ........... 333/26
7,027,792 B1 4/2006 Luff et al.
7,061,317 B2 * 6/2006 Petrovic et al. ............... 330/149
2010/0064265 A1 * 3/2010 Inoue ................................ 716/4
2010/0141339 A1 * 6/2010 Day .............................. 330/149

FOREIGN PATENT DOCUMENTS

KR 10-2009-0104160 A 10/2009

* cited by examiner

*Primary Examiner* — Dean Takaoka
(74) *Attorney, Agent, or Firm* — NSIP Law

(57) ABSTRACT

There is provided a differential mode amplifier driving circuit, including: a first port having one end connected to a single signal; a second port having one end connected to a differential signal; a first transmission line having one end grounded; and a third port having one end connected to the first transmission line and the other end connected to the differential signal.

16 Claims, 3 Drawing Sheets

DIFFERENTIAL MODE AMPLIFIER DRIVING CIRCUIT

CROSS-REFERENCE TO RELATED APPLICATIONS

This application claims the priority of Korean Patent Application No. 10-2011-0145244 filed on Dec. 28, 2011, in the Korean Intellectual Property Office, the disclosure of which is incorporated herein by reference.

BACKGROUND OF THE INVENTION

1. Field of the Invention

The present invention relates to a differential mode amplifier driving circuit capable of simplifying a circuit and reducing a loss generated in a passive device, by only applying an input signal to one input terminal of the differential mode amplifier, without using a balun.

2. Description of the Related Art

Generally, a differential mode is frequently used in an amplifier such as a low noise amplifier (LAN), a power amplifier (PA), or the like, in an IC chip for a millimeter-wave band signal transmitting and receiving system. When an amplifier is designed by using the differential mode, a virtual ground may be utilized and noise characteristics may be improved as compared with a single mode.

However, a separate balun circuit for converting a single mode signal into a differential mode signal is required, in order to combine a differential mode amplifier with other components operated in a single mode.

An additive circuit, such as a marchand balun circuit, a rat race circuit, or the like, is required in order to operate a differential mode circuit of the related art in a single mode, that is, through a single input. The marchand balun circuit uses the coupling of two ¼ wavelength transmission lines, while the rat race circuit also uses a ¾ wavelength long transmission line. These circuits occupy a large area within an IC chip, and may cause a large loss at a high frequency within a millimeter-wave band or a tera-hertz band.

According to the Related Art Documents, Patent Document 1 (US Patent Registration No. 7027792) discloses that a single radio frequency (RF) and a differential local oscillator (LO) are present at an input terminal, as a single balanced mixer. However, this constitution requires differential input at a local oscillator (LO) input terminal, and thus, a balun circuit is required at the LO input terminal in the case in which an output of an oscillator generating an LO signal is in a single mode. Patent Document 2 (Korean Patent Registration No. 2009-0104160) does not disclose that a differential mode amplifier is driven without a balun circuit.

SUMMARY OF THE INVENTION

An aspect of the present invention provides a differential mode amplifier driving circuit for driving a differential mode amplifier without using a balun circuit by only applying an input signal to one input terminal of the differential mode amplifier.

According to one aspect of the present invention, there is provided a differential mode amplifier driving circuit, including: a first port having one end connected to a single signal; a second port having one end connected to a differential signal; a first transmission line having one end grounded; and a third port having one end connected to the first transmission line and the other end connected to the differential signal.

The differential mode amplifier driving circuit may further include a second transmission line having one end connected to the first port and the other end connected to the second port.

The first transmission line and the second transmission line may each be micro-strip lines.

The first transmission line may have a length, regulated such that a gain of a differential mode amplifier connected to the second port and the third port has a maximal value.

According to another aspect of the present invention, there is provided a differential mode amplifier driving circuit, including: an input port having one end inputting a single input signal thereto; a first output port having one end outputting a first differential output signal therefrom; a first transmission line having one end grounded; and a second output port having one end connected to the first transmission line and the other end outputting a second differential output signal therefrom.

The differential mode amplifier driving circuit may further include a second transmission line having one end connected to the input port and the other end connected to the first output port.

The first transmission line and the second transmission line may each be micro-strip lines.

The second transmission line may be 50 ohm-matched.

The first transmission line may have a length, regulated such that a gain of a differential mode amplifier connected to the first output port and the second output port has a maximal value.

Here, total reflection termination may be generated in the first transmission line having one end grounded.

According to another aspect of the present invention, there is provided a differential mode amplifier driving circuit, including: a first input port having one end inputting an input signal thereto; an odd mode port having one end outputting an odd mode signal therefrom; a first transmission line having one end grounded; and an even mode port having one end connected to the first transmission line and the other end outputting an even mode signal therefrom.

The differential mode amplifier driving circuit may further include a second transmission line having one end connected to the first input port and the other end connected to the odd mode port.

The second transmission line may be 50 ohm-matched.

The first transmission line and the second transmission line may each be micro-strip lines.

The first transmission line may have a length, regulated such that the input signal is maximally transmitted to the odd mode port at a predetermined frequency.

The first transmission line may have a length, regulated such that a gain of a differential mode amplifier connected to the odd mode port and the even mode port has a maximal value.

Here, total reflection termination may be generated in the first transmission line having one end grounded.

Here, a reflection coefficient at the odd mode port may be 0.

A differential mode amplifier connected to the odd mode port and the even mode port may be impedance-matched to the odd mode port.

The differential mode amplifier driving circuit may further include a second input port having no input signal inputted thereto, wherein a product of a reflection coefficient at the even mode port and a reflection coefficient at the second input port is −1.

Here, an absolute value of the reflection coefficient at the second input port may be 1, and a phase difference between the reflection coefficient at the even mode port and the reflection coefficient at the second input port may be 180 degrees.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
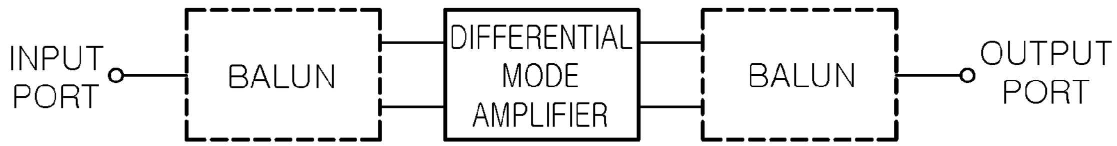
FIG. 1 is a block diagram of a balun for driving a differential mode amplifier with a single signal and the differential mode amplifier.

Various embodiments of the present invention will be described with reference to the accompanying drawings. The embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art. In the drawings, the shapes and dimensions may be exaggerated for clarity, and the same reference numerals will be used throughout to designate the same or like components.

FIG. 1 is a block diagram of a balun for driving a differential mode amplifier with a single signal and the differential mode amplifier.

As shown in FIG. 1, a balun for converting a single signal into a differential signal is generally required in order to drive a device operating in a differential mode, such as a differential mode amplifier. However, this balun may occupy a large area within an IC chip, and may cause a large loss at a high frequency.

Figure 2:
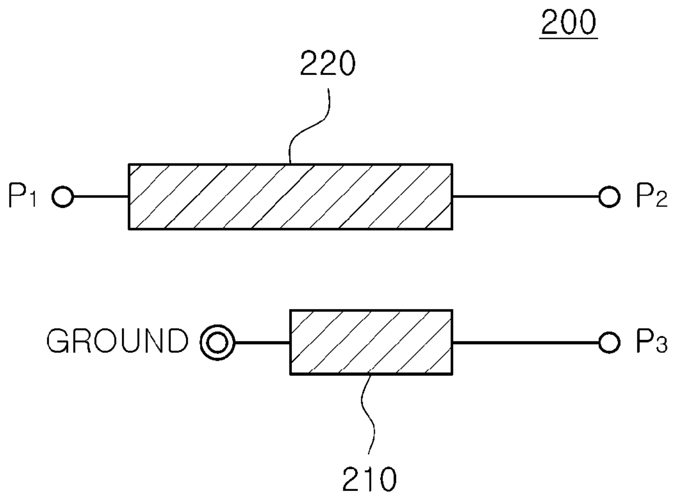
FIG. 2 is a schematic view of a differential mode amplifier driving circuit according to an embodiment of the present invention.

FIG. 2 is a schematic view of a differential mode amplifier driving circuit according to an embodiment of the present invention.

As shown in FIG. 2, a differential mode amplifier driving circuit 200 according to an embodiment of the present invention may include a first port $P_1$, a second port $P_2$, a third port $P_3$, and a first transmission line 210.

Here, one end of the first port $P_1$ may be connected to a single signal. The single signal may be an input signal. Here, the first port $P_1$ may become an input port. One end of the second port $P_2$ may be connected to a differential signal. Alternatively, a differential output signal may be outputted from the second port $P_2$. Here, the second port $P_2$ may become a first output port. One end of the first transmission line 210 may be grounded to perform total reflection termination. Here, the grounding may be performed through a metal via.

One end of the third port $P_3$ may be connected to the first transmission line 210 and the other end thereof may be connected to the differential signal. Also, a differential output signal may be outputted from the third port $P_3$. Here, the third port $P_3$ may become a second output port.

The first transmission line 210 may be controlled such that a gain of a differential mode amplifier connected to the second port $P_2$ and the third port $P_3$ reaches a maximum level. Specifically, the gain of the differential mode amplifier may reach a maximum level by regulating a length of the first transmission line 210 and a phase value according to the length.

Here, the differential mode amplifier driving circuit 200 according to the embodiment may further include a second transmission line 220 provided between the first port $P_1$ and the second port $P_2$.

One end of the second transmission line 220 may be connected to the first port $P_1$ and the other end thereof may be connected to the second port $P_2$.

Each of the first transmission line 210 and the second transmission line 220 may be formed of a micro-strip line, and have impedance controlled depending on a width thereof and a phase controlled depending on a length thereof. In particular, the second transmission line 220 may be 50 ohm matched, and thus, only the phase thereof may be changed without changing a magnitude of a signal passing through the second transmission line 220

The third port $P_3$ may be grounded through the first transmission line 210. Here, the grounding may be carried out by using a metal via, and total reflection termination may be generated in the metal via.

Figure 3:
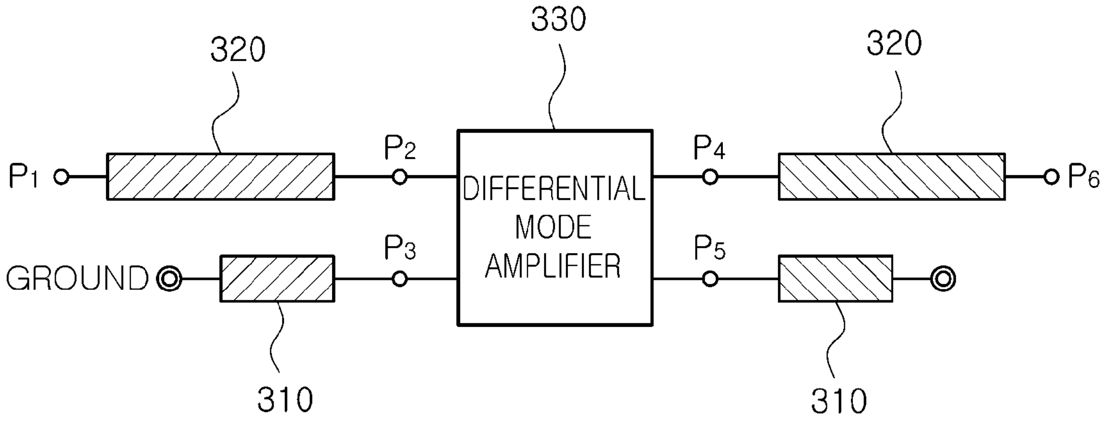
FIG. 3 is a schematic view of a differential mode amplifier and a differential mode amplifier driving circuit according to an embodiment of the present invention.

FIG. 3 is a schematic view of a differential mode amplifier and a differential mode amplifier driving circuit according to an embodiment of the present invention.

As shown in FIG. 3, a differential mode amplifier 330 and a differential mode amplifier driving circuit according to an embodiment of the present invention may include a first port $P_1$, a second port $P_2$, a third port $P_3$, a fourth port $P_4$, a fifth port $P_5$, a sixth port $P_6$, first transmission lines 310 and second transmission lines 320.

A single input signal may be inputted to the first port $P_1$, and the second port $P_2$ and the third port $P_3$ may be connected to the differential mode amplifier 330. One of the second transmission lines 320 may be disposed between the first port $P_1$ and the second port $P_2$, and the third port $P_3$ may be connected to one of the first transmission lines 310 which is grounded. A signal outputted from the differential mode amplifier 330 may be connected to the differential mode amplifier driving circuit including the fourth port $P_4$, the fifth port $P_5$, the other first transmission line 310, and the other second transmission line 320 and re-converted into a single signal.

Figure 4A:
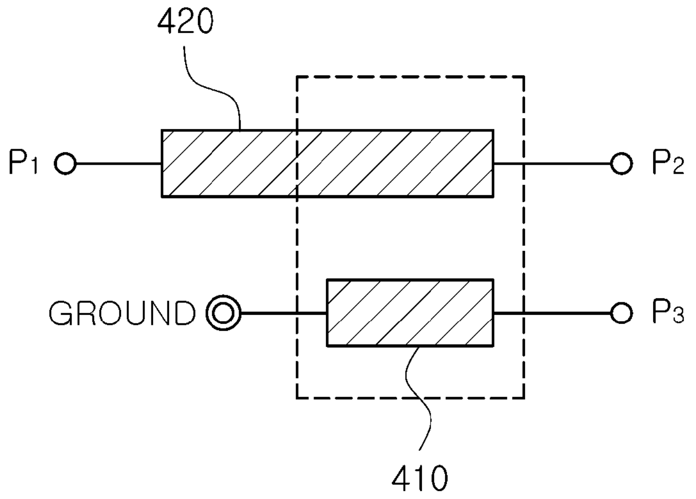
FIGS. 4A to 4C are schematic views showing a differential mode amplifier driving circuit according to an embodiment of the present invention and four ports for a short transmission line, including two virtual ports.
Figure 4B:
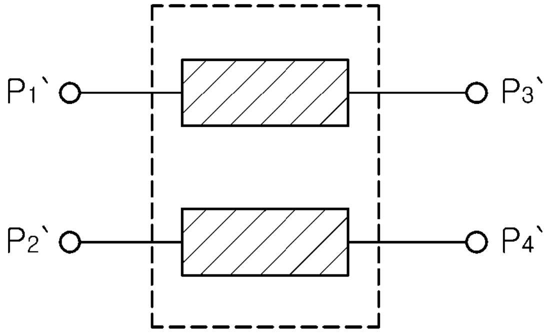
Figure 4C:
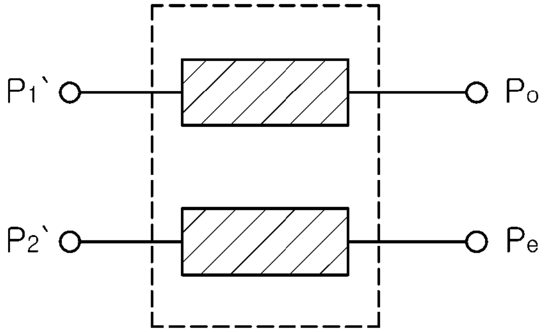

FIGS. 4A to 4C are schematic views showing a differential mode amplifier driving circuit according to an embodiment of the present invention and four ports for a short transmission line, including two virtual ports.

FIG. 4A shows a differential mode amplifier driving circuit according to an embodiment of the present invention. FIG. 4B shows four ports for a short transmission line corresponding to a portion designated by a dotted line, that is, a first input port $P_1'$, a second input port $P_2'$, a third input port $P_3'$, and a fourth input port $P_4'$.

FIG. 4C shows an odd mode port $P_o$ and an even mode port $P_e$, instead of the third input port $P_3'$ and the fourth input port $P_4'$, which are actual physical ports.

An input signal is inputted to one end of the first input port $P_1$; but may not be inputted to the second input port $P_2'$.

An odd mode signal is outputted from one end of the odd mode port $P_o$, and an even mode signal is outputted from one end of the even mode port $P_e$. The odd mode port $P_o$ is a virtual port from which the odd mode signal generated at a second port $P_2$ and a third port $P_3$ of FIG. 4A is outputted, and also, the even mode port $P_e$ is a virtual port from which the even mode signal generated at the second port $P_2$ and the third port $P_3$ of FIG. 4B is outputted.

For example, when it is assumed that a signal of "1" is inputted to a first port $P_1$ of FIG. 4A, the signal of "1" and a signal of "0" may be outputted from the second port $P_2$ and the third port $P_3$ of FIG. 4A, respectively. However, since 1 is the sum of ½ and ½ and 0 is the sum of ½ and −½, it can be seen that a signal of "½" and a signal of "½" are outputted from the even mode port $P_e$, the virtual port, and a signal of "½" and a signal of "−½" are outputted from the odd mode port $P_o$, the virtual port. In other words, the respective even mode signal and the odd mode signal may be generated on halves. In the case in which the length of the first transmission line 410 according to the embodiment of the present invention is appropriately regulated, when a single input signal may be inputted, the odd mode signal may be maximally outputted.

Hereinafter, there will be described conditions for maximally transmitting a signal from the first input port $P_1'$ to the odd mode port $P_o$, that is, conditions for allowing transmission coefficients of an input signal inputted to the first input port $P_1'$ and an output signal of the odd mode port $P_o$ to have the maximal values.

An S-parameter with respect to two lines each having a short length as shown in FIG. 4B may be represented by Expression 1 below.

$$S = \begin{pmatrix} 0 & 0 & 1 & 0 \\ 0 & 0 & 0 & 1 \\ 1 & 0 & 0 & 0 \\ 0 & 1 & 0 & 0 \end{pmatrix} \qquad \text{[Expression 1]}$$

Here, in the case in which the odd mode port $P_o$ and the even mode port $P_e$ are defined, instead of the third input port $P_3'$ and the fourth input port $P_4'$, as shown in FIG. 4, a matrix representing the S-parameter may be obtained by mode conversion matrix C given by Expression 2 below.

$$C = \frac{1}{\sqrt{2}} \begin{pmatrix} 0 & 0 & 1 & 1 \\ 0 & 0 & -1 & 1 \\ 1 & -1 & 0 & 0 \\ 1 & 1 & 0 & 0 \end{pmatrix} \qquad \text{[Expression 2]}$$

Here, when it is assumed that the differential mode amplifier at a rear stage of the odd mode port $P_o$ is impedance-matched to the odd mode port $P_o$, a reflection coefficient at the odd mode port $P_o$ may become 0.

Here, a signal which is transmitted by the first input port $P_1'$ to the odd mode port $P_o$ may be represented by Expression 3 below.

$$T_{odd} = C_{31} + \frac{C_{41}E_{11}C_{24}\Gamma_t C_{32}}{1 - E_{11}C_{24}\Gamma_t C_{42}} \qquad \text{[Expression 3]}$$

Here, $C_{31}$, $C_{41}$, $C_{24}$, $C_{32}$, and $C_{42}$ are defined by Expression 2 above, and $E_{11}$ is a reflection coefficient at the even mode port $P_e$ and determined by the amplifier connected to the rear stage of the even mode port $P_e$. In addition, $\Gamma t$ is a reflection coefficient at the second input port $P_2'$.

In the case in which the differential mode amplifier connected to the rear stage of the odd mode port $P_o$ and the even mode port $P_e$ is impedance-matched to the odd mode port $P_o$, the reflection coefficient $E_{11}$ at the even mode port $P_e$ may generally have a large value, and a phase of the reflection coefficient may be varied depending on a matching circuit design of the differential mode amplifier.

In order to allow a transmission coefficient at the odd mode port $P_o$ to have the maximal value, the product of the reflection coefficient $E_{11}$ at the even mode port $P_e$ and the reflection coefficient $\Gamma t$ at the second input port $P_2'$ to which the input signal is not inputted needs to be −1. To this end, an absolute value of $\Gamma t$ is 1, and a phase difference between the reflection coefficient $E_{11}$ at the even mode port $P_e$ and the reflection coefficient $\Gamma t$ at the second input port $P_2'$ needs to be 180 degrees. Therefore, in the case in which the length of the first transmission line 410 is regulated so as to satisfy the condition as above, the odd mode signal may be maximally transmitted.

Figure 5A:
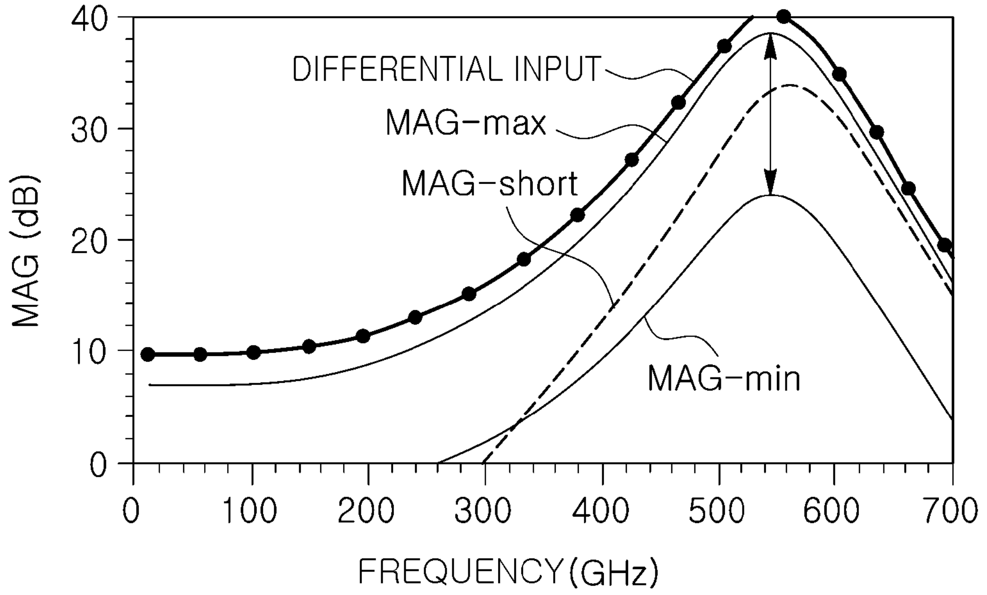
FIGS. 5A and 5B are graphs each showing maximum available gains (MAGs) and gains of a differential mode amplifier in the case in which the differential mode amplifier driving circuit according to an embodiment of the present invention is used.
Figure 5B:
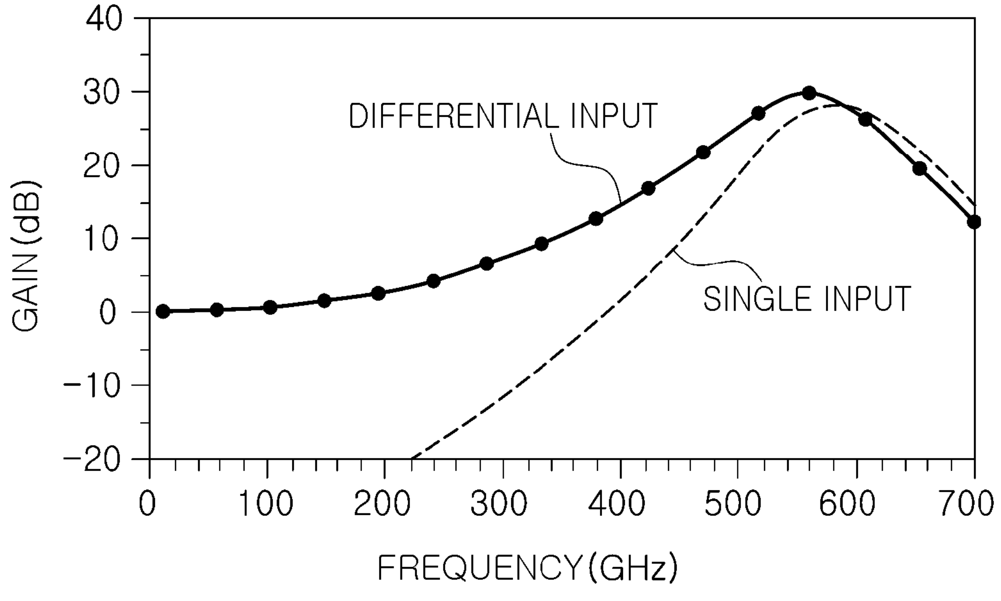

FIGS. 5A and 5B are graphs each showing maximum available gains (MAGs) and gains of a differential mode amplifier in the case in which the differential mode amplifier driving circuit according to an embodiment of the present invention is used.

FIG. 5A shows MAGs in the case of applying an differential input and in the case of applying a single input to the differential mode amplifier. The case in which an single input is applied may be divided into three cases, a case in which the MAG shows the maximal value (MAG_max), a case in which the MAG shows the minimum value (MAG_min), and a case in which the first transmission line is simply short-circuited (MAG_short), by changing the length of the first transmission line 410 to control the phase thereof. Here, the maximal value of MAG is exhibited by regulating the length of the first transmission line 410 so as to satisfy the above conditions. It can be seen from FIG. 5A that MAG values in the case in which the MAG shows the maximal value (MAG_max) are slightly different from MAG values in the case in which the differential input is applied. In addition, according to FIG. 5A, it is not sufficient to merely short-circuit the first transmission line in order to allow the MAG to have the maximal value. The above conditions, that is, an absolute value of $\Gamma t$ is 1, and a phase difference between the reflection coefficient $E_{11}$ at the even mode port $P_e$ and the reflection coefficient $\Gamma t$ at the second input port $P_2'$ is 180 degrees, need to be satisfied.

FIG. 5B shows gains measured by actually adding a matching circuit to the differential mode amplifier. It can be seen from FIG. 5B that there is no significant difference in gain at a frequency of 500 GHz or higher between the case in which an differential input is applied and the case in which the single input is applied by regulating the length of the first transmission line 410 so as to satisfy the above conditions.

In other words, in driving the differential mode amplifier with a single input signal as above, the length of the first transmission line 410, which is grounded to perform total reflection termination without a separate balun may be regulated to change the phase thereof, thereby maximally transmitting the signal to the odd mode port $P_o$.

As set forth above, according to the embodiments of the present invention, there is provided a differential mode amplifier driving circuit for driving a differential mode amplifier without using a balun circuit by only applying an input signal to one input terminal of the differential mode amplifier, thereby simplifying the circuit and reducing a loss generated in a passive device.

While the present invention has been shown and described in connection with the exemplary embodiments, it will be apparent to those skilled in the art that modifications and variations can be made without departing from the spirit and scope of the invention as defined by the appended claims.

What is claimed is:

1. A differential mode amplifier driving circuit, comprising:

a first port having one end connected to a single-ended signal;

a second port having one end connected to a differential signal;

a first transmission line having one end grounded; and a third port having one end connected to the first transmission line and the other end connected to the differential signal, wherein the first transmission line has a length determined such that a gain of a differential mode amplifier connected to the second port and the third port has a maximum value, and wherein a total reflection termination is generated in the first transmission line having one end grounded.

2. The differential mode amplifier driving circuit of claim 1, further comprising a second transmission line having one end connected to the first port and the other end connected to the second port.

3. The differential mode amplifier driving circuit of claim 2, wherein the first transmission line and the second transmission line are each micro-strip lines.

4. A differential mode amplifier driving circuit, comprising:

an input port having one end inputting a single-ended input signal thereto;

a first output port having one end outputting a first differential output signal therefrom, a first transmission line having one end grounded; and a second output port having one end connected to the first transmission line and the other end outputting a second differential output signal therefrom, wherein the first transmission line has a length determined such that a gain of a differential mode amplifier connected to the first output port and the second output port has a maximum value, and wherein a total reflection termination is generated in the first transmission line having one end grounded.

5. The differential mode amplifier driving circuit of claim 4, further comprising a second transmission line having one end connected to the input port and the other end connected to the first output port.

6. The differential mode amplifier driving circuit of claim 5, wherein the first transmission line and the second transmission line are each micro-strip lines.

7. The differential mode amplifier driving circuit of claim 5, wherein the second transmission line is 50 ohm-matched.

8. A differential mode amplifier driving circuit, comprising:

a first input port having one end inputting an input signal thereto;

an odd mode port having one end outputting an odd mode signal therefrom;

a first transmission line having one end grounded; and an even mode port having one end connected to the first transmission line and the other end outputting an even mode signal therefrom, wherein the first transmission line has a length, determined such that the input signal is maximally transmitted to the odd mode port at a predetermined frequency, wherein total reflection termination is generated in the first transmission line having one end grounded.

9. The differential mode amplifier driving circuit of claim 8, further comprising a second transmission line having one end connected to the first input port and the other end connected to the odd mode port.

10. The differential mode amplifier driving circuit of claim 9, wherein the second transmission line is 50 ohm-matched.

11. The differential mode amplifier driving circuit of claim 9, wherein the first transmission line and the second transmission line are each micro-strip lines.

12. The differential mode amplifier driving circuit of claim 8, wherein the first transmission line has a length, regulated such that a gain of a differential mode amplifier connected to the odd mode port and the even mode port has a maximal value.

13. The differential mode amplifier driving circuit of claim 8, wherein a reflection coefficient at the odd mode port is 0.

14. The differential mode amplifier driving circuit of claim 8, wherein a differential mode amplifier connected to the odd mode port and the even mode port is impedance-matched to the odd mode port.

15. The differential mode amplifier driving circuit of claim 8, further comprising a second input port having no input signal inputted thereto, wherein a product of a reflection coefficient at the even mode port and a reflection coefficient at the second input port is −1.

16. The differential mode amplifier driving circuit of claim 15, wherein an absolute value of the reflection coefficient at the second input port is 1, and a phase difference between the reflection coefficient at the even mode port and the reflection coefficient at the second input port is 180 degrees.

* * * * *